United States Patent
Onvlee et al.

(10) Patent No.: US 7,633,600 B2
(45) Date of Patent: Dec. 15, 2009

(54) LITHOGRAPHIC APPARATUS AND DEVICE MANUFACTURING METHOD

(75) Inventors: Johannes Onvlee, s-Hertogenbosch (NL); Dirk-Jan Bijvoet, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 516 days.

(21) Appl. No.: 11/262,963

(22) Filed: Nov. 1, 2005

(65) Prior Publication Data

US 2007/0099099 A1    May 3, 2007

(51) Int. Cl.
*G03B 27/62* (2006.01)
*G03B 27/58* (2006.01)
*G03B 27/42* (2006.01)

(52) U.S. Cl. .............................. 355/75; 355/72; 355/53

(58) Field of Classification Search ................... 355/72, 355/75, 53; 356/399, 400, 401; 250/548; 318/649; 310/10, 12; 430/5
See application file for complete search history.

(56) References Cited

U.S. PATENT DOCUMENTS

| | | | | |
|---|---|---|---|---|
| 6,040,096 A | * | 3/2000 | Kakizaki et al. | 430/5 |
| 2002/0001082 A1 | * | 1/2002 | Akimoto et al. | 356/400 |
| 2005/0117142 A1 | * | 6/2005 | Heerens et al. | 355/75 |
| 2007/0159616 A1 | * | 7/2007 | Van De Ven et al. | 355/75 |

FOREIGN PATENT DOCUMENTS

JP        2006100590 A  *  4/2006

* cited by examiner

*Primary Examiner*—Peter B Kim
(74) *Attorney, Agent, or Firm*—Pillsbury Winthrop Shaw Pittman LLP

(57) ABSTRACT

A lithographic apparatus has a patterning support holding a patterning device. At least one position sensor measures a position of the patterning device relative to the patterning support, and generates a measuring signal. A positioning device controls a position of the patterning support on the basis of the measuring signal input to the positioning device. In a corresponding device manufacturing method a patterning support is provided. A patterning device is held on the patterning support. The patterning support is moved along a line of movement. A position of the patterning device relative to the patterning support is measured, and a position of the patterning support is controlled on the basis of the measurement of the position of the patterning device relative to the patterning support. Thus, the controlling of the position of the patterning support compensates for a slip of the patterning device relative to the patterning support.

16 Claims, 5 Drawing Sheets

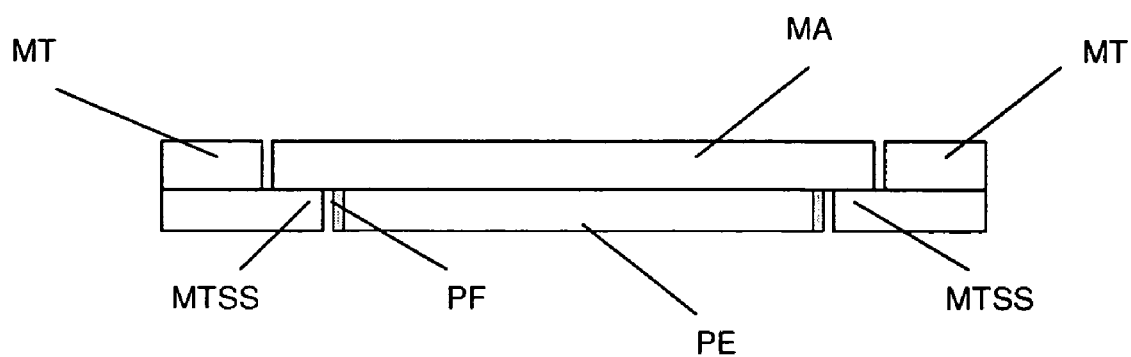
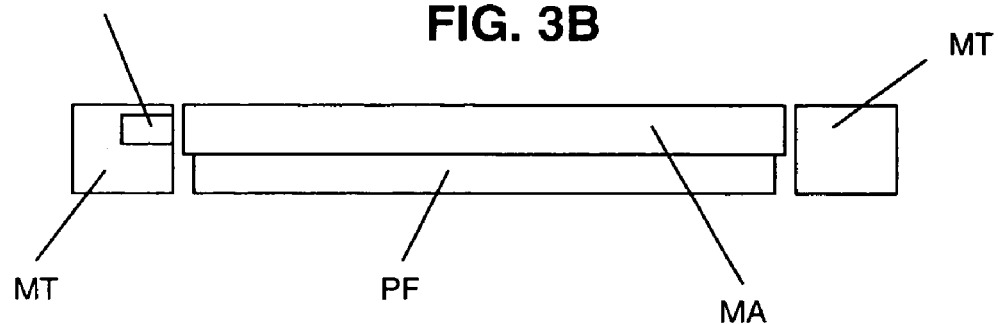

LITHOGRAPHIC APPARATUS AND DEVICE MANUFACTURING METHOD

BACKGROUND

1. Field of the Invention

The present invention relates to a lithographic apparatus and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging, using a projection system, onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a scanning type lithographic apparatus, a reticle (patterning device) is coupled to a reticle stage. While generating a pattern on a target portion of a substrate, the reticle stage performs scanning movements along a line of movement, where the scan direction alternates between two successive scanning movements. For such a change of direction, it is desirable to decelerate and accelerate the reticle stage between the successive scanning movements. Also, it is desirable to accelerate and decelerate the reticle stage before and after each scanning movement in a specific direction. Conventionally, the scanning movements are made with constant velocity. However, the scanning movements may also at least partly be made with varying velocity, e.g. the movements including at least part of the deceleration and/or acceleration phases.

The reticle stage supports, i.e. bears the weight of, the reticle. It holds the reticle in a manner that depends on the orientation of the reticle, the design of the lithographic apparatus, and other conditions, such as for example whether or not the reticle is held in a vacuum environment. The reticle stage may comprise a frame or a table, for example, which may be fixed or movable as required. The reticle stage may ensure that the reticle is at a desired position, for example with respect to the projection system.

The reticle is coupled to the reticle stage through a coupling. Conventionally, the reticle is coupled to the reticle stage through a vacuum coupling which may be implemented as one or more vacuum pads provided on the reticle stage, where at least a part of a circumferential area of the reticle is held onto the vacuum pads. Thus, a normal force between adjacent surfaces of the reticle and the reticle stage is generated, resulting in a friction between contacting surfaces of the reticle and the reticle stage. The vacuum pads comprise one or more openings coupled to a gas discharge and supply system. At a discharge of gas, the part of the circumferential area of the reticle is held against the reticle stage, while at a supply of gas, the reticle is decoupled from the reticle stage, e.g. to exchange the reticle. Instead of a vacuum coupling between the reticle and the reticle stage, other forms of couplings based on friction between the reticle and the reticle stage are conceivable, such as electrostatic or mechanical clamping techniques to hold the reticle against the reticle stage.

In an ongoing development, increasing throughput requirements placed on lithographic apparatus lead to increasing scanning velocities. Consequently, deceleration and acceleration of the reticle stage increase. In the deceleration and acceleration phases, increased inertia forces act on the reticle stage and on the reticle.

It is known that inertia forces acting on the reticle stage and the reticle may lead to slip of the reticle and the reticle stage relative to each other. The slip usually is in the order of nanometers. For relatively low decelerations and accelerations, the slip has appeared to be low and approximately constant over time, changing its direction with each deceleration/acceleration phase. In such circumstances, the slip may be ignored if it is sufficiently low, or the slip may be compensated by suitably calibrating a positioning device controlling the position (and hence, the movement) of the reticle stage and/or the substrate stage.

However, with increasing decelerations and accelerations, the slip occurring between the reticle and the reticle stage increases, and becomes variable and unpredictable. Factors influencing the amount of slip may comprise a flatness and roughness of the surfaces of the reticle and the reticle stage engaging each other, a humidity of the atmosphere(s) in which the reticle and the reticle stage are handled, a contamination of the reticle or the reticle stage, and a degree of vacuum when the reticle is held on the reticle stage by vacuum pads. Thus, a calibration of the positioning device will not lead to a correct positioning of the reticle stage and/or the substrate stage under the circumstances of high inertia forces.

SUMMARY

It is desirable to correct position errors of the reticle due to slip between the reticle and the reticle stage resulting from high decelerations and accelerations.

According to an embodiment of the invention, there is provided a lithographic apparatus comprising a patterning support constructed to hold a patterning device, the patterning support being movable along a line of movement; at least one position sensor configured to measure a position of the patterning device relative to the patterning support, and to generate a measuring signal; and a positioning device configured to control a position of the patterning support on the basis of the measuring signal input to the positioning device.

According to an embodiment of the invention, there is provided lithographic apparatus comprising: a patterning support constructed to hold a patterning device, the patterning support being movable along a line of movement, and the patterning device being capable of imparting a radiation beam with a pattern in its cross-section to form a patterned radiation beam; a substrate support constructed to hold a substrate, whereby the patterned radiation beam is projected onto a target portion of the substrate; at least one position sensor configured to measure a position of the patterning device relative to the patterning support, and to generate a measuring signal; and a positioning device configured to control a position of at least one of the patterning support and the substrate support on the basis of the measuring signal input to the positioning device.

According to an embodiment of the invention, there is provided a device manufacturing method comprising: providing a patterning support; holding a patterning device on the patterning support; moving the patterning support along a line of movement; measuring a position of the patterning device relative to the patterning support; and controlling a position of the patterning support on the basis of the measurement of the position of the patterning device relative to the patterning support.

According to an embodiment of the invention, there is provided a device manufacturing method comprising: providing a patterning support; providing a substrate support; holding a patterning device on the patterning support, the patterning device being capable of imparting a radiation beam with a pattern in its cross-section to form a patterned radiation beam; holding a substrate on the substrate support; moving the patterning support and the substrate support along a line of movement; generating a radiation beam; projecting the patterned radiation beam on a target portion of the substrate; measuring a position of the patterning device relative to the patterning support; and controlling a position of at least one of the patterning support and the substrate support on the basis of the measurement of the position of the patterning device relative to the patterning support.

According to an embodiment of the invention, there is provided a device manufactured using the apparatus as defined above.

According to an embodiment of the invention, there is provided a device manufactured according to the method as defined above.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3A schematically depicts a cross-section of the patterning stage holding a patterning device according to FIG. 2 along the line IIIA-IIIA thereof;

FIG. 3B schematically depicts a cross-section of the patterning stage holding a patterning device according to FIG. 2 along the line IIIB-IIIB thereof;

DETAILED DESCRIPTION

Figure 1:
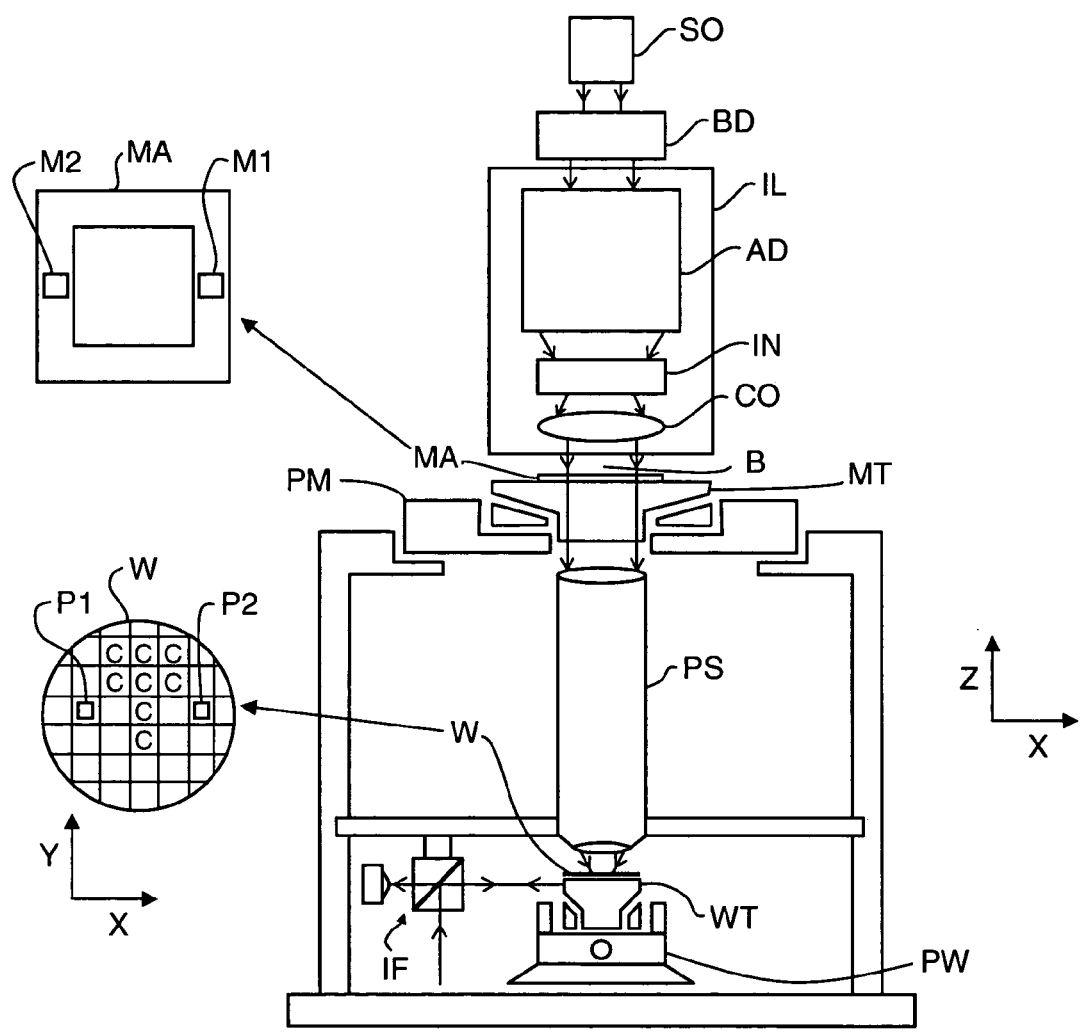
FIG. 1 schematically depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. The features of the positioning device PM and the position sensor will be elucidated in detail in the following Figures. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioning device PW. In the case of a stepper (as opposed to a scanner) the mask table MT may be connected to a short-stroke actuator only. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus may be used in the following scan mode.

In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

Entirely different modes of use may also be employed.

During operation of the lithographic apparatus in scan mode, the mask table MT executes scanning movements. The scan direction is alternated between two successive scanning movements. To alternate from one scanning direction to an opposite scanning direction, the mask table MT is decelerated while moving in the one scanning direction, stopped, and accelerated in the opposite scanning direction. The deceleration and acceleration generate large inertia forces leading to a slip between the mask MA and the mask table MT. Experiments have shown that the amount of slip is not predictable, since it depends on a large number of conditions. For a combination of a given mask MA on a given mask table MT under given conditions, however, the slip is substantially reproducible.

Figure 2:
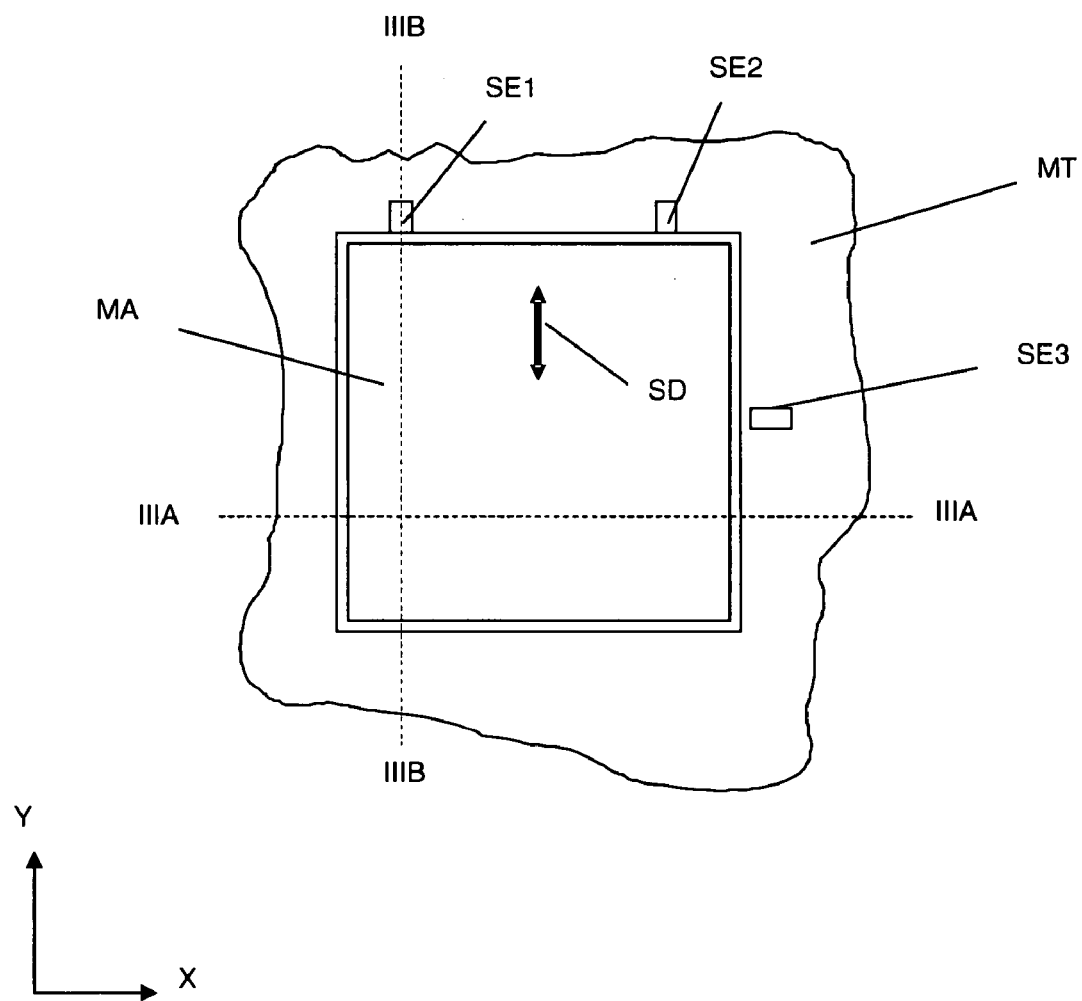
FIG. 2 schematically depicts a plan view of a patterning stage holding a patterning device.

FIG. 2 shows a mask table MT holding a mask MA. The mask table MT may be moved along a line in the scanning directions indicated by double arrow SD, which may also be referred to "up" and "down" in an Y direction (see coordinate axes X, Y) in FIG. 2. The mask table MT includes two position sensors SE1, SE2 located spaced from each other in an X direction to determine a Y position of the mask MA relative to the mask table MT. The position sensors SE1, SE2 may be embodied in various ways, e.g. as capacitive, inductive or optical sensors, or other non-contact position sensors. If the position sensors SE1, SE2 would be in contact with the mask MA, then e.g. a piezo-electric sensor may be used. Using two position sensors SE1, SE2 (or more position sensors in an X direction) allows for a determination of a linear displacement, i.e. slip, of the mask MA relative to the mask table MT in the scanning directions SD, as well as a rotation ($R_z$,) of the mask MA around an axis (Z axis) at right angles to the plane of the drawing of FIG. 2. Instead of two position sensors SE1, SE2, a single position sensor may be used, which single position sensor may be arranged at a central position with respect to a side of the mask MA facing the single sensor. Alternatively, more than two position sensors may be used.

Referring to FIGS. 2, 3A, and 3B, opposite side areas of the mask MA are supported on the mask table MT at two opposite side supports MTSS thereof. In the areas of the mask MA and the mask table MT engaging each other, the mask table MT is provided with vacuum pads provided in the upper surface of the mask table side supports MTSS for holding the mask MA against the side supports MTSS. FIGS. 3A and 3B further show the mask MA being provided with a pellicle frame PF having a pellicle PE.

It is noted here that in addition to the position sensors SE1, SE2 shown in FIG. 2, also one or more position sensors SE3 may be provided to determine an X displacement, i.e. slip, of the mask MA relative to the mask table MT.

Further position sensors may be provided to determine a torsion, e.g. in an $R_x$ direction, of the mask MA relative to the mask table MT due to acceleration and deceleration forces, so as to be able to correct for this torsion to decrease or eliminate a defocus which could otherwise result from the torsion of the mask MA.

Figure 4:
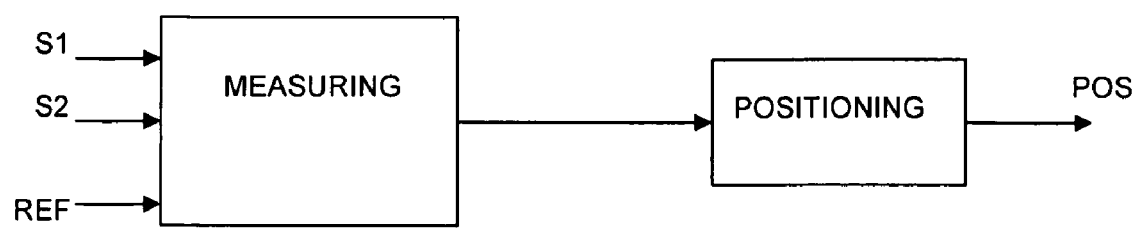
FIG. 4 shows a schematic block diagram of a positioning device.

FIG. 4 illustrates a positioning device having inputs receiving measuring signals S1, S2 from position sensors SE1, SE2, respectively. A further input may receive a reference signal REF. The measured signals may be processed to provide one or more positioning signals POS which control a position, possibly in different degrees of freedom, of at least one of the mask table MT and a substrate support WT on the basis of the input signals S1, S2 and REF. A difference between the signals S1 and S2 may indicate a rotation of the mask MA relative to the mask table MT. Signals from position sensors measuring e.g. X or Z position of the mask MA may be processed analoguously.

Figure 5:
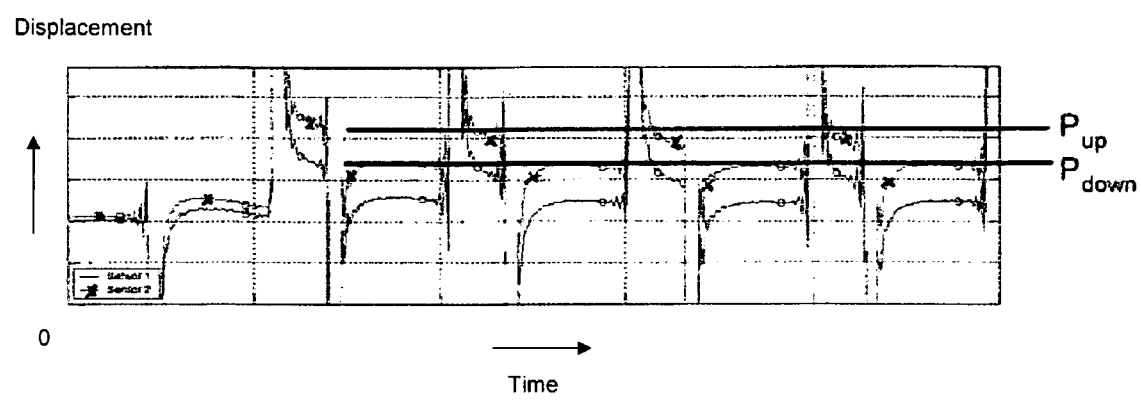
FIG. 5 shows graphs illustrating a slip of a patterning device relative to a patterning support during movement of the patterning device and the patterning support.

Referring to FIG. 5, an experiment was performed, moving a mask MA clamped on a mask table MT in opposite directions SD (a movement in a direction including an acceleration phase, a constant velocity phase, and a deceleration phase), and measuring the position of the mask MA relative to the mask table MT with position sensors SE1, SE2 (indicated in FIG. 5 as Sensor 1, Sensor 2, respectively) in an arrangement as illustrated in FIG. 2. FIG. 5 shows measurement signals obtained from the position sensors SE1 and SE2. Between an acceleration (which was selected to be 86 ms$^{-2}$) and a subsequent deceleration in each of the directions of movement, the position of the mask MA relative to the mask table MT is measured ($P_{up}$ and $P_{down}$). The level $P_{up}$ is the (stable) position of the mask MA after acceleration in the up direction measured by Sensor 2, and $P_{down}$ is the (stable) position after acceleration in the down direction measured by Sensor 2. In the experiment, the difference between $P_{up}$ and $P_{down}$ is 8 nm. It is noted that the mask table MT had no time to settle in the up direction, which accounts for the absence of a stable position in this direction. However, the positions $P_{up}$ and $P_{down}$ remain substantially the same after a number of changes of the direction of movement, which effect may be used to prepare or condition the clamping between the mask MA and the mask table MT prior to actually using the mask MA in a lithographic process, by moving the patterning support with the patterning device coupled to it in opposite directions at least once before measuring a position of the patterning device relative to the patterning support.

From further experiments it appears that with increasing accelerations/decelerations, the difference between $P_{up}$ and $P_{down}$ increases.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

As required, detailed embodiments of the present invention are disclosed herein. However, it is to be understood that the disclosed embodiments are merely exemplary of the invention, which can be embodied in various forms. Thus, it will be apparent to one skilled in the art that modifications may be made to the invention as described without departing from the scope of the claims set out below. Specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting, but rather to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

The invention may at least partially take the form of a computer program containing one or more sequences of machine-readable instructions describing a method as disclosed above, or a data storage medium (e.g. semiconductor memory, magnetic or optical disk) having such a computer program stored therein. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

What is claimed is:

1. A lithographic apparatus comprising:
   a patterning support constructed to hold a patterning device, the patterning support being movable along a line of movement;
   at least one position sensor supported by the patterning support and configured to measure a position of the patterning device relative to the patterning support and to generate a measuring signal; and
   a positioning device configured to control a position of the patterning support based on the measuring signal input to The positioning device.

2. The lithographic apparatus of claim 1, comprising two position sensors spaced apart in a direction substantially perpendicular to the line of movement of the patterning support.

3. The lithographic apparatus of claim 1, wherein The at least one position sensor is selected from a group of position sensors consisting of a capacitive sensor, an inductive sensor, an optical sensor, and a piezo-electric sensor.

4. A lithographic apparatus comprising:
a patterning support constructed to hold a patterning device, the patterning support being movable along a line of movement, and the patterning device being configured to impart a radiation beam with a pattern in its cross-section to form a patterned radiation beam;
a substrate support constructed to hold a substrate, wherein the patterned radiation beam is projected onto a target portion of the substrate,
at least one position sensor supported by the patterning support and configured to measure a position of the patterning device relative to the patterning support and to generate a measuring signal; and
a positioning device configured to control a position of at least one of the patterning support and the substrate support based on the measuring signal input to the positioning device.

5. The lithographic apparatus of claim 4, comprising two position sensors spaced apart in a direction substantially perpendicular to the line of movement of the patterning support.

6. The lithographic apparatus of claim 4, wherein the at least one position sensor is selected from a group of position sensors consisting of a capacitive sensor, an inductive sensor, an optical sensor, and a piezo-electric sensor.

7. A device manufacturing method comprising:
holding a patterning device on a patterning support;
moving the patterning support along a line of movement;
measuring a position of the patterning device relative to the patterning support with a position sensor supported by the patterning support; and
controlling a position of the patterning support based on the measurement of the position of the patterning device relative to the patterning support.

8. The device manufacturing method of claim 7, wherein the controlling of the position of the patterning support includes compensating for a slip of the patterning device relative to the patterning support.

9. The device manufacturing method of claim 7, wherein during a movement of the patterning support in one direction along the line of movement, the position of the patterning device relative to the patterning support is measured, and wherein during a subsequent movement of the patterning support the position of the patterning support is controlled.

10. The device manufacturing method of claim 9, wherein said subsequent movement of the patterning support is in said one direction.

11. The device manufacturing method of claim 9, wherein the position of the patterning device relative to the patterning support is measured during a constant velocity part of said movement of the patterning support in said one direction.

12. The device manufacturing method of claim 7, wherein the position of the patterning device relative to the patterning support is measured at two or more locations for different degrees of freedom.

13. The device manufacturing method of claim 7, wherein the position of the patterning device relative to the patterning support is measured at two locations spaced apart in a direction substantially perpendicular to the line of movement of the patterning support, and wherein a position of the patterning support is controlled based on a difference between the measurements at the two locations of the position of the patterning device relative to the patterning support.

14. The device manufacturing method of claim 13, wherein the controlling of the position of the patterning support includes compensating for a rotation of the patterning device relative to the patterning support.

15. The device manufacturing method of claim 7, wherein the patterning support is moved in said line of movement in opposite directions at least once before measuring a position of the patterning device relative to the patterning support.

16. A device manufacturing method comprising:
holding a patterning device on a patterning support, the patterning device being configured to impart a radiation beam with a pattern in its cross-section to form a patterned radiation beam;
holding a substrate on a substrate support;
moving the patterning support and the substrate support along a line of movement;
generating a radiation beam;
projecting the patterned radiation beam on a target portion of the substrate;
measuring a position of the patterning device relative to the patterning support with a position sensor supported by the patterning support; and
controlling a position of at least one of the patterning support and the substrate support based on the measurement of the position of the patterning device relative to the patterning support.

* * * * *